US009896746B2

(12) United States Patent
Suo et al.

(10) Patent No.: US 9,896,746 B2
(45) Date of Patent: Feb. 20, 2018

(54) METHOD FOR PREPARING ELEMENT DIFFUSION-TYPE COMPOSITE SUBSTRATE

(71) Applicant: BEIJING UNIVERSITY OF TECHNOLOGY, Beijing (CN)

(72) Inventors: Hongli Suo, Beijing (CN); Yichen Meng, Beijing (CN); Lin Ma, Beijing (CN); Min Liu, Beijing (CN); Yi Wang, Beijing (CN); Mangmang Gao, Beijing (CN); Hui Tian, Beijing (CN); Yaru Liang, Beijing (CN); Pan Wang, Beijing (CN); Faxue Peng, Beijing (CN); Jing Liu, Beijing (CN); Tiantian Wang, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 172 days.

(21) Appl. No.: 14/711,541

(22) Filed: May 13, 2015

(65) Prior Publication Data

US 2016/0211437 A1    Jul. 21, 2016

(30) Foreign Application Priority Data

Jan. 21, 2015    (CN) .......................... 2015 1 0030433

(51) Int. Cl.
*B22F 3/15*    (2006.01)
*B22F 3/24*    (2006.01)
(Continued)

(52) U.S. Cl.
CPC ................ *C22C 19/03* (2013.01); *B22F 3/15* (2013.01); *B22F 3/24* (2013.01); *C22F 1/10* (2013.01);
(Continued)

(58) Field of Classification Search
CPC .................................................. H01L 39/2454
See application file for complete search history.

(56) References Cited

U.S. PATENT DOCUMENTS

| 1,765,955 | A | * | 6/1930 | Von Maltitz | C21D 9/561 266/112 |
| 3,805,571 | A | * | 4/1974 | Toda | B21B 31/10 266/108 |
| 2009/0269605 | A1 | * | 10/2009 | Warke | B21C 23/22 428/550 |

OTHER PUBLICATIONS

Suo et al., "Development of cube textured Ni-W alloy substrates used for coated conductors," presented at the 11th European Conference on Applied Superconductivity, Genova, Italy, Sep. 2013.*

(Continued)

*Primary Examiner* — Colin W. Slifka
(74) *Attorney, Agent, or Firm* — J. C. Patents

(57) ABSTRACT

A method for preparing element diffusion-type composite substrate and it belongs to the field of high-temperature coated superconductor substrate preparation. The rolled composite nickel-tungsten alloy substrate is heated and thermally insulated, meanwhile, both ends of the rolled substrate are applied with a low voltage and high current density pulse current. High-performance nickel-tungsten alloy composite substrate is obtained with the method in the present invention and the sandwich-like composite substrate has low ferromagnetism and high strength due to higher solute diffusion from inner layer to outer layer, yet which does not affect the formation of sharp cubic texture on the surface of the composite substrate. On the one hand, the adoption of electric pulse technology accelerates the inter-diffusion effect of inter-layer elements, on the other hand, it promotes the recrystallization nucleation and reduces the recrystallization annealing temperature of the composite substrate, thus energy saving effect is achieved and the negative effects of annealing thermal erosion grooves among (Continued)

crystal boundary to subsequent coating are effectively reduced. Alloy composite substrate prepared in this invention has the characteristics of high cubic texture content, low magnetism, high strength, and can be applied to large-scale industrial production.

6 Claims, 4 Drawing Sheets

(51) Int. Cl.
 *C22C 19/03* (2006.01)
 *C22F 1/10* (2006.01)
 *H01L 39/00* (2006.01)
 *H01L 39/12* (2006.01)
 *H01L 39/24* (2006.01)

(52) U.S. Cl.
 CPC ..... *B22F 2003/248* (2013.01); *H01L 39/2454* (2013.01)

(56) References Cited

OTHER PUBLICATIONS

Zhao et al., "Highly reinforced, low magnetic and biaxially textured Ni-7 at.%W/Ni-12 at.%W multi-layer substrates developed for coated conductors," Superconductor Science and Technology 21 075003, Apr. 2008.*

Gao et al., "Characterization and properties of an advanced composite substrate for YBCO-coated conductors," Acta Materialia 58(4), pp. 1299-1308, Feb. 2010.*

Bhattacharjee et al., "Nickel base substrate tapes for coated superconductor applications," Journal of Materials Science 42(6), pp. 1984-2001, Mar. 2007.*

Conrad et al., "Effect of electric current pulses on the recrystallization of copper," Scripta Metallurgica 17(3), pp. 411-416, Mar. 1983.*

Liu et al., "Fabrication of textured Ni-9.3at.%W substrate by electropulsing intermediate annealing method," Physica C: Superconductivity and its Applications 497, pp. 119-122, Dec. 2013.*

Zhang, "Effect of electropulsing treatment on microstructure and machinability in ultra-precision machining of Mg-9Al-1Zn alloy," thesis, Hong Kong Polytechnic University, Nov. 2010, http://hdl.handle.net/10397/5341.*

* cited by examiner

METHOD FOR PREPARING ELEMENT DIFFUSION-TYPE COMPOSITE SUBSTRATE

CROSS-REFERENCE TO RELATED APPLICATION

This application claims the priority benefit of Chinese application serial no. 201510030433.6, filed on Jan. 21, 2015, the content of which is hereby incorporated by reference herein and made a part of this specification.

TECHNICAL FIELD

This invention relates to a method for preparing a cube textured nickel-tungsten alloy composite substrate used for high-temperature coated superconductor, and it belongs to the field of high-temperature coated superconducting substrate preparation technology.

BACKGROUND ART

Coated superconducting material is one of the high-temperature superconducting materials with broad application prospects and great potential commercial value. In a textured metal substrate used for coated conductors, since the core of the composite substrate is made of high-strength, non-ferromagnetic alloy material, the mechanical and magnetic properties of the entire composite substrate with high cube textured surface are further improved, so that the composite substrate is one of the new metal alloy substrates with high performance and high potential application value. Element diffusion composite substrate has been proven to be a high performance textured metal substrate used for coated conductor, which has the capability to obtain sharp cube texture and has a good interface binding force between the inner layer and the outer layer.

Currently, Ni—W alloy substrate is one of the most widely studied substrate materials in scientific research. Compared to smelting method, it is easier for powder metallurgy method for preparing a composite substrate to achieve interlayer element diffusion. In addition, the recrystallization temperature in the powder metallurgy method is much higher than that in the smelting method, and thus the powder metallurgy method has more pronounced diffusion effect than the smelting method. Hot isostatic pressing technique is more suitable for preparing large billets to achieve large scale industrial production of composite substrates. But exorbitant annealing temperature will deepen the depth and width of thermal erosion grooves, which is unfavorable to further coating a transit layer on the surface of the composite substrate. In view of this, powder metallurgy method is taken in the present invention for preparing element diffusion composite Ni—W alloy substrate. By using electric pulse technology, a high-frequency and low-voltage large pulse current is passed through a substrate being annealed in the furnace in the process of dynamic annealing, which thereby greatly enhances the interdiffusion of interlayer elements in the composite substrate and reduces the recrystallization temperature of the substrate to some extent.

In the aspect of liquid metal solidification, the pulse current treatment leads to increase in metal solidification temperature, decrease in solidification time and temperature gradient, solidification structure refinement and mechanical property improvement; in the aspect of solid metal element diffusion, electric pulse technology can enhance diffusion coefficient and reduce diffusion annealing temperature. Reduced energy consumption-during high temperature annealing can reduce costs. In addition to enhancing the interdiffusion effect of interlayer elements of the composite substrate, the main effect of high-energy electric pulse is due to the interaction between electrons and dislocations, which can greatly enhance the process of recrystallization of the alloy, but it just promotes recrystallization nucleation in the deformed tissue and has no significant effect on the mechanisms of nucleation in deformed band and the final texture of composite substrate.

In summary, sandwich-like Ni—W alloy composite substrate prepared with the powder metallurgic method is more favorable to interdiffusion of interlayer elements, by which higher concentration W sufficiently diffuses from the inner layer to the outer layer, leading to the ferromagnetic character of the entire composite substrate being weakened. Electric pulse accelerates element diffusion effect of the composite substrate, meanwhile improves the surface roughness of the composite substrate indirectly, so that the general application performance of the composite substrate is further improved.

The method according to the present invention can be applied to large-scale production of high-performance composite substrate by a vertical dynamic annealing device.

SUMMARY OF THE INVENTION

This invention is to provide a method for preparing element diffusion type composite Ni—W alloy substrate in powder metallurgy method, characterized in following specific steps:

(1) Ni powder and W powder with a purity of greater than 99.9% are provided in the proportion of 8% and 12% atomic percentage of W, respectively; after each of the two different proportion raw materials is mixed evenly by high-energy ball milling, the mixed powders are sequentially and hierarchically loaded into a vacuum thin-wall wrap for hot isostatic pressing, with the temperature of 1100~1200° C., the pressure of 150 MPa and the time of 10~30 min, respectively; preferably, three layer structured powder, with the volume ratio of 1:2:1, is sequentially loaded into the vacuum thin-wall wrap; wherein, Ni, W mixed powder with higher W content is loaded into the middle layer.

(2) After the hot isostatic pressing treatment, the billet is subjected to a heat treatment for homogenization and to hot rolling cogging, then the billet is cold rolled into a 70~100 μm thick composite substrate; the total deformation is 99 to 99.3%;

(3) The composite substrate is subjected to dynamic recrystallization annealing heat treatment in a vertical heat treatment furnace under hydrogen argon protective atmosphere; moving rate of the composite substrate is 5~10 mm/min, total time of the composite substrate moving at constant temperature area (1000~1300 C) is 1 h~2 h; preferably, at the same time, a pulse current is passed through the annealing composite substrate in the heat treatment furnace, wherein the gap between electrodes is 900 mm, the pulse frequency is 150~300 Hz, the current density is 450~650 A/mm$^2$ and DC voltage is less than 5V; the pulse current is directly applied on the surface of the composite substrate through two metal guide rollers located on the top and bottom of the inner wall of the heat treatment furnace; the metal guide rollers are made of oxygen-free pure copper and connected to the positive and negative electrodes of a pulse current generator, respectively. The annealing device is schematically shown in FIG. 1; the composite substrate is eventually moved out of the heat treatment furnace with a coil take-up system, which gives rise to an air cooling effect.

The key to the present invention is to develop a technology for preparing special nickel-tungsten alloy composite substrate used for coated conductor, to obtain an alloy substrate with excellent properties; compared to traditional single-layer nickel-tungsten alloy substrate, cube texture content, ferromagnetic properties and strength of the entire substrate in this invention are improved; nickel tungsten alloy composite substrate prepared with the combination of powder metallurgy and electric pulse annealing technology is easier to achieve mutual diffusion of interlayer elements. The present invention can be applied to large-scale industrial production of composite substrate.

In the present invention, the rolled composite nickel-tungsten alloy substrate is heated and kept at certain temperature, meanwhile, a low voltage and high current density pulse current is applied to two ends of the rolled substrate. High-performance nickel-tungsten alloy composite substrate is obtained with the method in the present invention and the sandwich-like composite substrate has low ferromagnetic property and high strength due to diffusion of the higher concentration solute from the inner layer to the outer layer, yet which does not affect the formation of sharp cube texture on the surface of the substrate. On the one hand, the adoption of electric pulse technology accelerates interdiffusion effect of interlayer elements, on the other hand, it promotes the recrystallization nucleation and reduces the recrystallization annealing temperature of the substrate, thus energy saving effect is achieved and the negative effects of annealing thermal erosion grooves among crystal boundary to subsequent coating are effectively reduced. The alloy composite substrate prepared in this invention has the characteristics of high cube texture content, low magnetism, high strength, and can be applied to large-scale industrial production.

The invention is further illustrated in conjunction with the figures and the embodiments below.

EMBODIMENTS

This invention is further illustrated by the embodiments, but is not limited to by the following embodiments.

Embodiment 1

Figure 1:
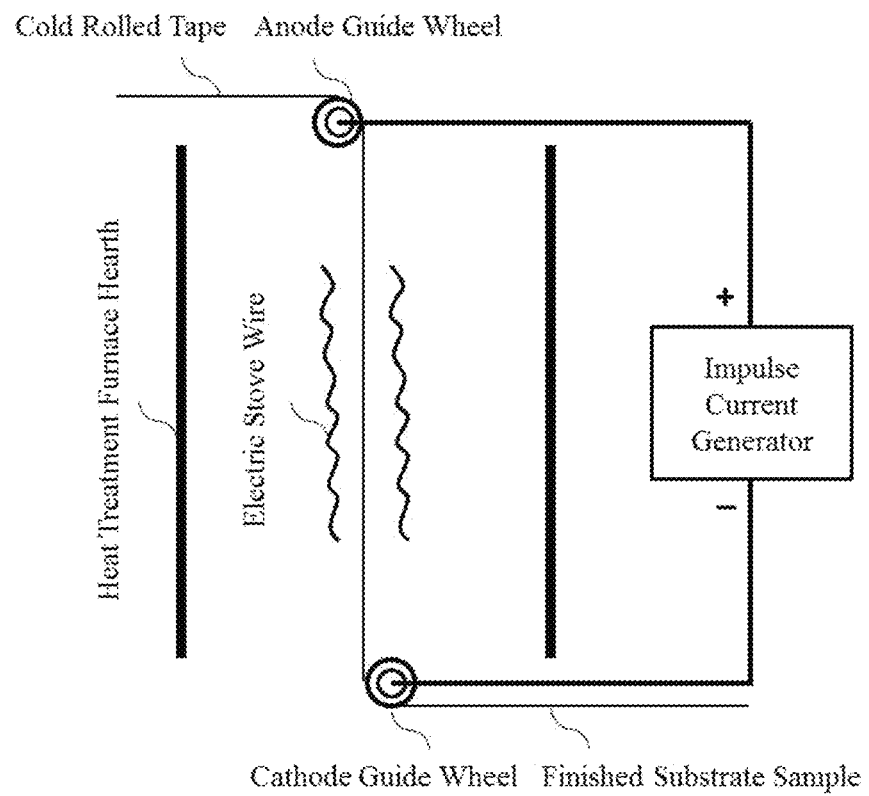
FIG. 1 is a schematic diagram of an annealing device.
Figure 2:
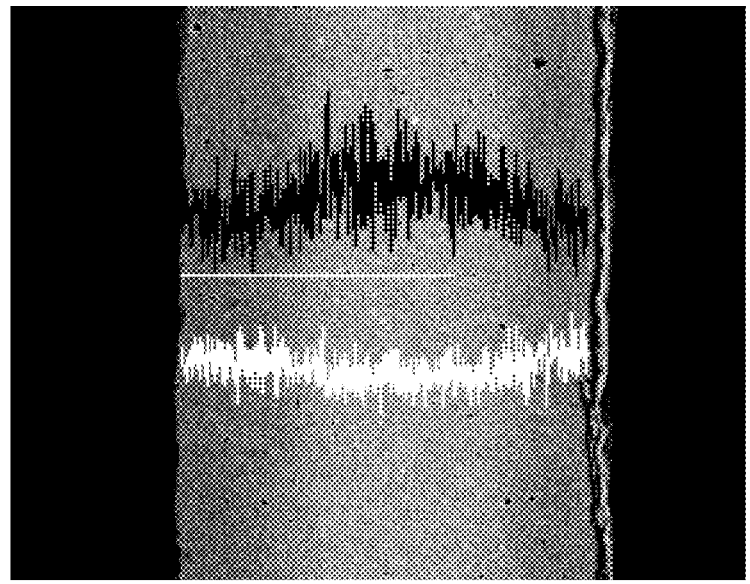
FIG. 2 is an element distribution curve along RD-ND section of a Ni—W alloy composite substrate measured by EDS line scanning according to embodiment 1.

Ni powder and W powder with a purity of greater than 99.95% are provided in the proportion of 8% and 12% atomic percentage of W, respectively; each of the two differently proportioned raw materials is mixed evenly by high-energy ball milling and then three layers of the mixed powders with the volume ratio of 1:2:1 are sequentially and hierarchically loaded into a vacuum thin-wall wrap for hot isostatic pressing, wherein, Ni, W mixed powder with higher W content is loaded into the middle layer, the hot isostatic pressing is carried out under a temperature of 1200° C., a pressure of 150 MPa and the time of 25 min; after the hot isostatic pressing treatment, the billet is subjected to a heat treatment for homogenization and to hot rolling cogging, the billet is then cold rolled into a 80 μm thick composite substrate, the total deformation is 99%; the composite substrate is subjected to dynamic recrystallization annealing heat treatment in a vertical heat treatment furnace ventilating hydrogen argon protective atmosphere; at a moving rate of 10 mm/min, the total time of the composite substrate-moving at constant temperature area 1150° C. for 1 h; at the same time, a pulse current is applied to the annealing composite substrate in the heat treatment furnace with a gap of 900 mm between electrodes, a pulse frequency of 250 Hz, a current density of 530 A/mm$^2$, a DC voltage of 3V; the composite substrate is eventually moved slowly out of the heat treatment furnace with a coil take-up system, which gives rise to an air cooling effect; a section of the composite substrate that has passed through the constant temperature area is cut and measured to get an element distribution curve along the ND direction by EDS line scanning, as shown in FIG. 2.

Embodiment 2

Figure 3:
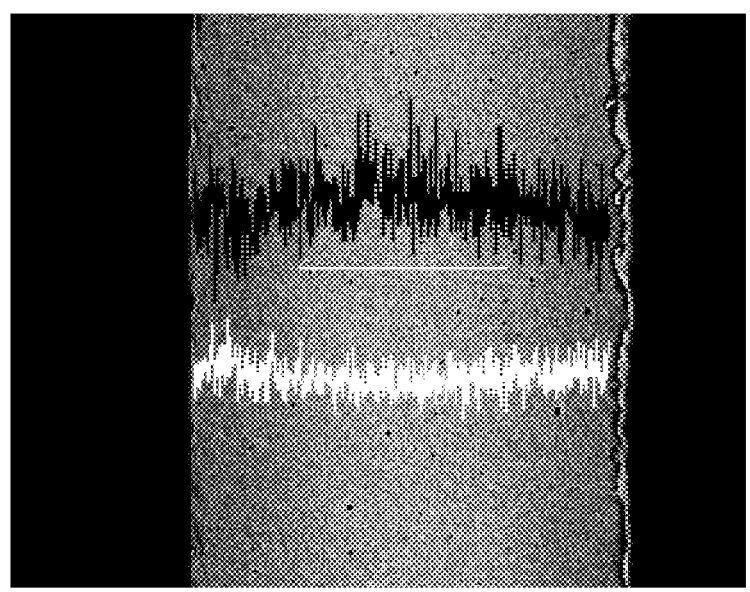
FIG. 3 is an element distribution curve along RD-ND section of a Ni—W alloy composite substrate measured by EDS line scanning according to embodiment 2.

Ni powder and W powder with a purity of greater than 99.95% are provided in the proportion of 8% and 12% atomic percentage of W, respectively; each of the two differently proportioned raw materials is mixed evenly by high-energy ball milling and then three layers of the mixed powders with the volume ratio of 1:2:1 are sequentially and hierarchically loaded into a vacuum thin-wall wrap for hot isostatic pressing, wherein, Ni, W mixed powder with higher W content is loaded into the middle layer, the hot isostatic pressing is carried out under a temperature of 1200° C., a pressure of 150 MPa and the time of 25 min; after the hot isostatic pressing treatment, the billet is subjected to a heat treatment for homogenization and to hot rolling cogging, the billet is then cold rolled into a 80 μm thick composite substrate, the total deformation is 99%; the composite substrate is subjected to dynamic recrystallization annealing heat treatment in a vertical heat treatment furnace ventilating hydrogen argon protective atmosphere; at a moving rate of 5 mm/min, the total time of the composite substrate-moving at constant temperature area 1150° C. for 2 h; at the same time, a pulse current is applied to the annealing composite substrate in the heat treatment furnace with a gap of 900 mm between electrodes, a pulse frequency of 250 Hz, a current density of 530 A/mm$^2$, a DC voltage of 3V; the composite substrate is eventually moved slowly out of the heat treatment furnace with a coil take-up system, which gives rise to an air cooling effect; a section of the composite substrate that has passed through the constant temperature area is cut and measured to get an element distribution curve along the ND direction by EDS line scanning, as shown in FIG. 3.

Embodiment 3

Figure 4:
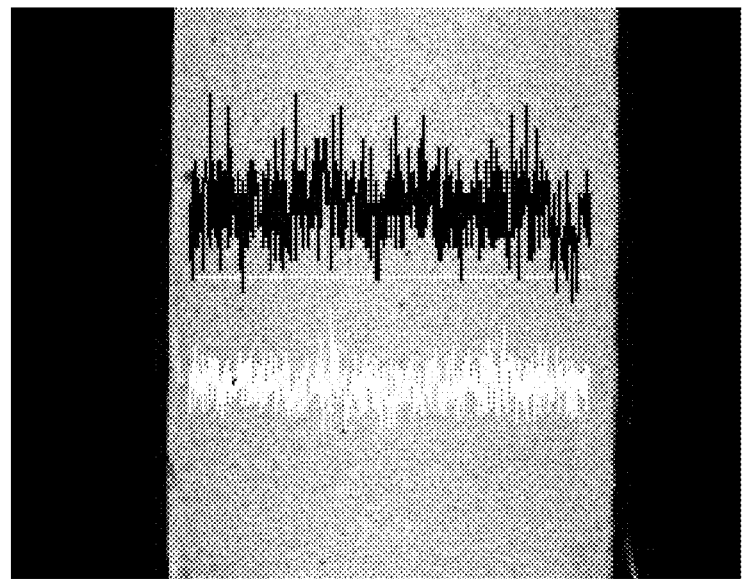
FIG. 4 is an element distribution curve along RD-ND section of a Ni—W alloy composite substrate measured by EDS line scanning according to embodiment 3.

Ni powder and W powder with a purity of greater than 99.95% are provided in the proportion of 8% and 12% atomic percentage of W, respectively; each of the two differently proportioned raw materials is mixed evenly by high-energy ball milling and then three layers of the mixed powders with the volume ratio of 1:2:1 are sequentially and hierarchically loaded into a vacuum thin-wall wrap for hot isostatic pressing, wherein, Ni, W mixed powder with higher W content is loaded into the middle layer, the hot isostatic pressing is carried out under a temperature of 1200° C., a pressure of 150 MPa and the time of 25 min; after the hot isostatic pressing treatment, the billet is subjected to a heat treatment for homogenization and to hot rolling cogging, the billet is then cold rolled into a 80 μm thick composite substrate, the total deformation is 99%; the composite substrate is subjected to dynamic recrystallization annealing heat treatment in a vertical heat treatment furnace ventilating hydrogen argon protective atmosphere; at a moving rate of 10 mm/min, the total time of the composite substrate-moving at constant temperature area 1250° C. for 1 h; at the same time, a pulse current is applied to the annealing composite substrate in the heat treatment furnace with a gap of 900 mm between electrodes, a pulse frequency of 280 Hz, a current density of 610 A/mm$^2$, a DC voltage of 3V; the composite substrate is eventually moved slowly out of the heat treatment furnace with a coil take-up system, which gives rise to an air cooling effect; a section of the composite substrate that has passed through the constant temperature area is cut and measured to get an element distribution curve along the ND direction by EDS line scanning, as shown in FIG. 4.

Embodiment 4

Figure 5:
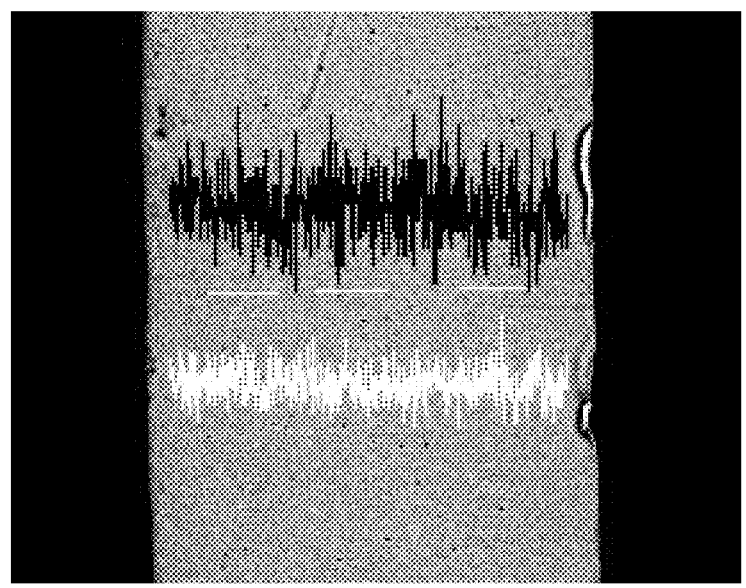
FIG. 5 is an element distribution curve along RD-ND section of a Ni—W alloy composite substrate measured by EDS line scanning according to embodiment 4.
Figure 6:
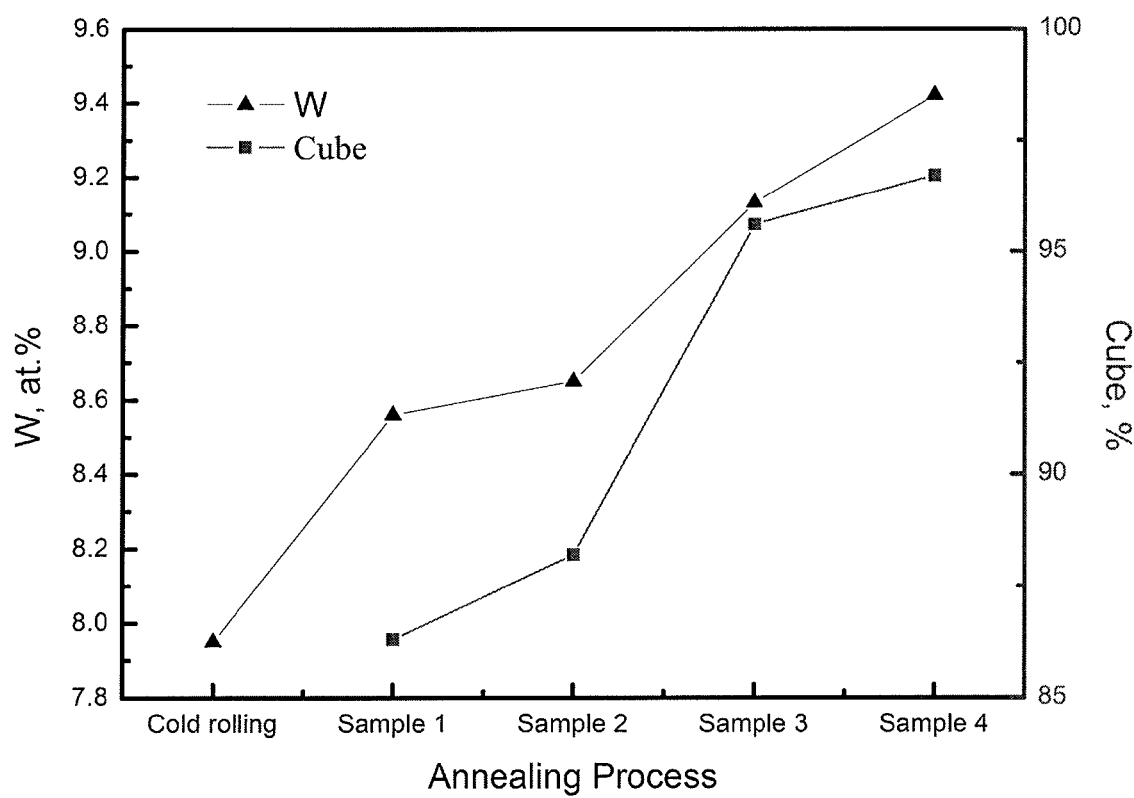
FIG. 6 is a distribution curve of element W content measured by XRF and cubic texture content measured by EBSD on the surface of a Ni—W alloy composite substrate prepared according to embodiments 1-4.

Ni powder and W powder with a purity of greater than 99.95% are provided in the proportion of 8% and 12% atomic percentage of W, respectively; each of the two differently proportioned raw materials is mixed evenly by high-energy ball milling and then three layers of the mixed powders with the volume ratio of 1:2:1 are sequentially and hierarchically loaded into a vacuum thin-wall wrap for hot isostatic pressing, wherein, Ni, W mixed powder with higher W content is loaded into the middle layer, the hot isostatic pressing is carried out under a temperature of 1200° C., a pressure of 150 MPa and the time of 25 min; after the hot isostatic pressing treatment, the billet is subjected to a heat treatment for homogenization and to hot rolling cogging, the billet is then cold rolled into a 80 μm thick composite substrate, the total deformation is 99%; the composite substrate is subjected to dynamic recrystallization annealing heat treatment in a vertical heat treatment furnace ventilating hydrogen argon protective atmosphere; at a moving rate of 5 mm/min, the total time of the composite substrate-moving at constant temperature area 1250° C. for 1 h; at the same time, a pulse current is applied to the annealing composite substrate in the heat treatment furnace with a gap of 900 mm between electrodes, a pulse frequency of 280 Hz, a current density of 610 A/mm$^2$, a DC voltage of 3V; the composite substrate is eventually moved slowly out of the heat treatment furnace with a coil take-up system, which gives rise to an air cooling effect; a section of the composite substrate that has passed through the constant temperature area is cut and measured to get an element distribution curve along the ND direction by EDS line scanning, as shown in FIG. 5.

What is claimed is:
1. A method for preparing element diffusion-type composite Ni—W alloy substrate, comprising the steps of:
(1) evenly mixing a first raw material by high-energy ball milling to obtain a first mixed powder, wherein the first raw material consists of 8% atomic percentage of W and 92% atomic percentage of Ni with a purity of greater than 99.9%, evenly mixing a second raw material by high-energy ball milling to obtain a second mixed powder, wherein the second raw material consists of 12% atomic percentage of W and 88% atomic percentage of Ni with a purity of greater than 99.9%, sequentially loading a first layer of the first mixed powder, a layer of the second mixed powder on the first layer of the first mixed powder, and a second layer of the first mixed powder on the layer of the second mixed powder into a vacuum thin-wall wrap for hot isostatic pressing, wherein the hot isostatic pressing is carried out for 10-30 min at a temperature of 1100~1200° C. and a pressure of 150 MPa;
(2) after the hot isostatic pressing, conducting heat treatment for homogenization and hot rolling cogging to form a billet, the billet then being cold rolled to form a 70~100 μm thick composite substrate, wherein a total deformation of the billet is 99 to 99.3%;
(3) conducting dynamic recrystallization annealing heat treatment on the composite substrate in a vertical heat treatment furnace with ventilating hydrogen argon protective atmosphere; wherein a moving rate of the composite substrate is 5~10 mm/min, a total time of the composite substrate moving at constant temperature area of 1000~1300° C. is 1 h~2 h; at the same time, a pulse current is passed through electrified to the composite substrate in the heat treatment furnace.
2. The method for preparing element diffusion-type composite Ni—W alloy substrate according to claim 1, wherein a volume ratio of the first layer of the first mixed powder to the layer of the second mixed powder to the second layer of the first mixed powder is 1:2:1.
3. The method for preparing element diffusion-type composite Ni—W alloy substrate according to claim 2, wherein the pulse current is directly applied on a surface of the composite substrate by two metal guide rollers located on a top and a bottom of the heat treatment furnace; the metal guide rollers are made of oxygen-free copper and connected to a positive electrode and a negative electrode of a pulse current generator, respectively.
4. The method for preparing element diffusion-type composite Ni—W alloy substrate according to claim 1, wherein parameters of the pulse current include an electrode gap of 900 mm, a pulse frequency of 150~300 Hz, a peak current density of 450~650 A/mm$^2$, a DC voltage of less than 5V.
5. The method for preparing element diffusion-type composite Ni—W alloy substrate according to claim 4, wherein the pulse current is directly applied on a surface of the composite substrate by two metal guide rollers located on a top and a bottom of the heat treatment furnace; the metal guide rollers are made of oxygen-free copper and connected to a positive electrode and a negative electrode of a pulse current generator, respectively.
6. The method for preparing element diffusion-type composite Ni—W alloy substrate according to claim 1, wherein the pulse current is directly applied on a surface of the composite substrate by two metal guide rollers located on a top and a bottom of the heat treatment furnace; the metal guide rollers are made of oxygen-free copper and connected to a positive electrode and a negative electrode of a pulse current generator, respectively.

* * * * *